United States Patent
Tamada et al.

(10) Patent No.: US 11,998,954 B2
(45) Date of Patent: Jun. 4, 2024

(54) SUBSTRATE PROCESSING APPARATUS AND SUBSTRATE PROCESSING METHOD

(71) Applicant: Tokyo Electron Limited, Tokyo (JP)

(72) Inventors: Jun Tamada, Kumamoto (JP); Junya Minamida, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/822,184

(22) Filed: Aug. 25, 2022

(65) Prior Publication Data

US 2023/0065374 A1    Mar. 2, 2023

(30) Foreign Application Priority Data

Aug. 26, 2021   (JP) ................... 2021-137779

(51) Int. Cl.
*B08B 17/02*    (2006.01)
*B08B 3/04*     (2006.01)

(52) U.S. Cl.
CPC ............... *B08B 17/02* (2013.01); *B08B 3/04* (2013.01)

(58) Field of Classification Search
None
See application file for complete search history.

(56) References Cited

FOREIGN PATENT DOCUMENTS

JP    2016-092144 A    5/2016

OTHER PUBLICATIONS

JP 2016092144A, Substrate Liquid Processing Apparatus, Exhaust Switching Unit, and Substrate Liquid Processing Method, Minamida (Year: 2016).*

* cited by examiner

*Primary Examiner* — Cristi J Tate-Sims
(74) *Attorney, Agent, or Firm* — Pearne & Gordon LLP

(57) ABSTRACT

A substrate processing apparatus includes a liquid processing unit configured to supply, onto a front surface of a substrate, individual multiple processing liquids different from each other; an exhaust unit configured to exhaust an exhaust gas exhausted from the liquid processing unit to an outside. The exhaust unit includes a main exhaust pipe including a first portion and a second portion, a first individual exhaust pipe, a second individual exhaust pipe, a switching unit and an outside air introduction pipe. The switching unit includes a first switching mechanism, a second switching mechanism, a third switching mechanism provided between the first portion and the second portion of the main exhaust pipe, an outside air introduction pipe connected to the second portion to allow outside air to be introduced into the second portion, and a fourth switching mechanism provided in the outside air introduction pipe.

20 Claims, 12 Drawing Sheets

SUBSTRATE PROCESSING APPARATUS AND SUBSTRATE PROCESSING METHOD

CROSS-REFERENCE TO RELATED APPLICATION

This application claims the benefit of Japanese Patent Application No. 2021-137779 filed on Aug. 26, 2021, the entire disclosure of which is incorporated herein by reference.

TECHNICAL FIELD

The exemplary embodiments described herein pertain generally to a substrate processing apparatus and a substrate processing method.

BACKGROUND

Patent Document 1 discloses a substrate processing apparatus equipped with a liquid processing unit configured to process a substrate by supplying a plurality of types of processing liquids to the substrate and an exhaust unit configured to exhaust an atmosphere in the liquid processing unit to the outside. The exhaust unit includes a plurality of individual exhaust pipes respectively corresponding to the types of processing liquids and a switching unit configured to guide a gas exhausted from the liquid processing unit to any one of the individual exhaust pipes. For example, if a gas or mist is generated when a predetermined processing liquid is supplied to the substrate in the liquid processing unit, the switching unit switches a flow path to connect the liquid processing unit with an individual exhaust pipe corresponding to the kind of the predetermined processing liquid.

Patent Document 1: Japanese Patent Laid-open Publication No. 2016-092144

SUMMARY

In one exemplary embodiment, a substrate processing apparatus includes a liquid processing unit configured to supply, onto a front surface of a substrate, individual multiple processing liquids including a first processing liquid and a second processing liquid different from the first processing liquid; and an exhaust unit configured to exhaust an exhaust gas exhausted from the liquid processing unit to an outside, the exhaust gas including a first exhaust gas exhausted from the liquid processing unit when the substrate is processed with the first processing liquid and a second exhaust gas exhausted from the liquid processing unit when the substrate is processed with the second processing liquid. The exhaust unit includes a main exhaust pipe configured to allow the exhaust gas to flow therein, the main exhaust pipe including a first portion located on an upstream side and a second portion located on a downstream side of the first portion; a first individual exhaust pipe configured to allow the first exhaust gas to flow therein; a second individual exhaust pipe configured to allow the second exhaust gas to flow therein; and a switching unit configured to selectively communicate the main exhaust pipe with one of the first individual exhaust pipe and the second individual exhaust pipe. The switching unit includes a first switching mechanism provided between the first portion and the first individual exhaust pipe and configured to switch between a communication state where the first portion communicates with the first individual exhaust pipe when the first exhaust gas is exhausted from the liquid processing unit and a non-communication state where the first portion does not communicate with the first individual exhaust pipe when the exhaust gas other than the first exhaust gas is exhausted from the liquid processing unit; a second switching mechanism provided between the second portion and the second individual exhaust pipe and configured to switch between a communication state where the second portion communicates with the second individual exhaust pipe when the second exhaust gas is exhausted from the liquid processing unit and a non-communication state where the second portion does not communicate with the second individual exhaust pipe when the exhaust gas other than the second exhaust gas is exhausted from the liquid processing unit; a third switching mechanism provided between the first portion and the second portion of the main exhaust pipe and configured to switch between a closed state where a flow of the first exhaust gas to the second portion is blocked when the first exhaust gas is exhausted from the liquid processing unit and an open state where a flow of the exhaust gas other than the first exhaust gas to the second portion is allowed when the exhaust gas other than the first exhaust gas is exhausted from the liquid processing unit; an outside air introduction pipe connected to the second portion to allow outside air to be introduced into the second portion; and a fourth switching mechanism provided in the outside air introduction pipe and configured to switch between an open state where the flow of the first exhaust gas to the second portion is allowed when the first exhaust gas is exhausted from the liquid processing unit and a closed state where a flow of the outside air to the second portion is blocked when the exhaust gas other than the first exhaust gas is exhausted from the liquid processing unit.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

In the detailed description that follows, exemplary embodiments are described as illustrations only since various changes and modifications will become apparent to those skilled in the art from the following detailed description. The use of the same reference numerals in different figures indicates similar or identical items.

DETAILED DESCRIPTION

Figure 1:
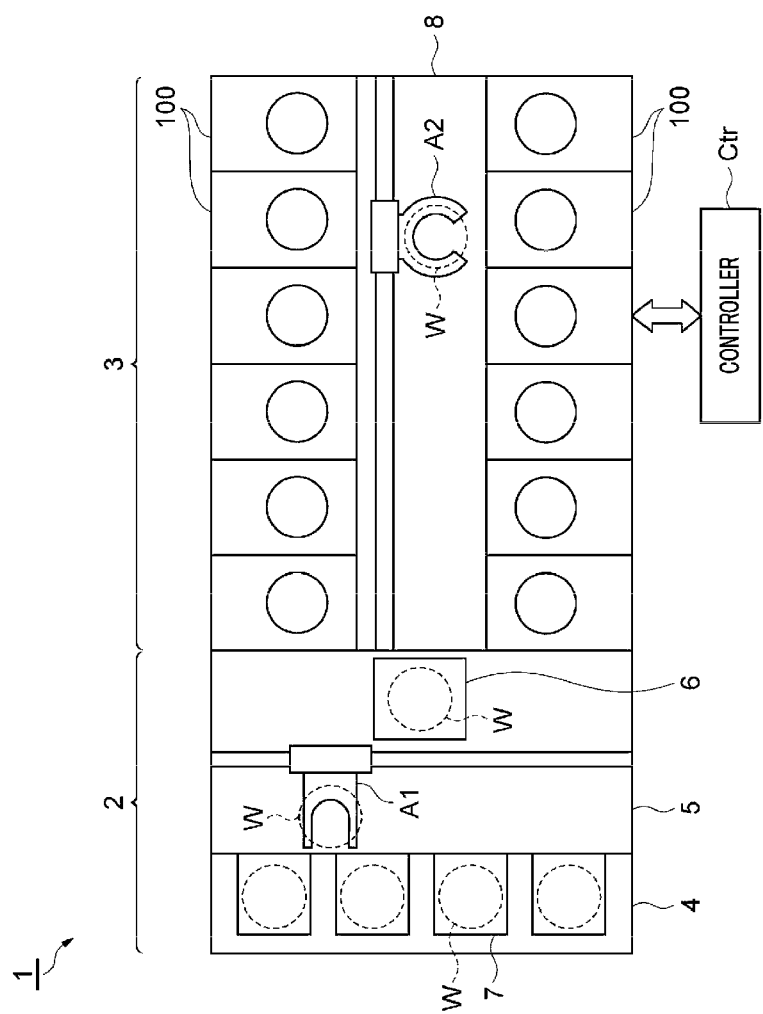
FIG. 1 is a schematic plan view illustrating an example of a substrate processing system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other exemplary embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

In the following description, same parts or parts having same function will be assigned same reference numerals, and redundant description will be omitted. Also, throughout the whole document, the terms "up", "down", "right" and "left" in the drawings are based on the directions of signs in the drawings.

Substrate Processing System

First, referring to FIG. 1 and FIG. 2, a substrate processing system (substrate processing apparatus) 1 configured to process a substrate W will be described. The substrate processing system 1 is equipped with a carry-in/out station 2, a processing station 3 and a controller Ctr. The carry-in/out station 2 and the processing station 3 may be arranged side by side in, for example, a horizontal direction.

The substrate W may have a circular plate shape, or may have a plate shape, such as a polygon, other than a circle. The substrate W may have a groove portion that is partially cut out. The groove portion may be, for example, a notch (a U-shaped or V-shaped groove) or a linear portion (so-called orientation flat) extending linearly. The substrate W may be, for example, a semiconductor substrate (silicon wafer), a glass substrate, a mask substrate, a flat panel display (FPD) substrate, or any of various other kinds of substrates. The substrate W may have a diameter of, e.g., about 200 mm to about 450 mm.

The carry-in/out station 2 includes a placing section 4, a carry-in/out section 5 and a shelf unit 6. The placing section 4 includes a plurality of placing tables (not shown) arranged in a width direction (up-and-down direction in FIG. 1). Each placing table is configured to place a carrier 7 (receptacle) thereon. The carrier 7 is configured to accommodate at least one substrate W in a sealed state. The carrier 7 includes an opening/closing door (not shown) through which the substrate W is carried in and out.

The carry-in/out section 5 is placed adjacent to the placing section 4 in a direction in which the carry-in/out station 2 and the processing station 3 are arranged (left-and-right direction in FIG. 1). The carry-in/out section 5 includes an opening/closing door (not shown) provided to correspond to the placing section 4. When the opening/closing door of the carrier 7 and the opening/closing door of the carry-in/out section 5 are both opened in a state where the carrier 7 is placed on the placing section 4, the inside of the carry-in/out section 5 communicates with the inside of the carrier 7.

The carry-in/out section 5 incorporates therein a transfer arm A1 and the shelf unit 6. The transfer arm A1 is configured to be movable horizontally in the width direction (up-and-down direction in FIG. 1), movable up and down in a vertical direction (up-and-down direction in FIG. 2) and pivotable about a vertical axis. The transfer arm A1 is configured to take out the substrate W from the carrier 7 and hand it over to the shelf unit 6, and also configured to receive the substrate W from the shelf unit 6 and return it back into the carrier 7. The shelf unit 6 is located near the processing station 3, and is configured to mediate the delivery of the substrate W between the carry-in/out section 5 and the processing station 3.

The processing station 3 includes a transfer section 8, a plurality of liquid processing units 100 and an exhaust unit 200. For example, the transfer section 8 extends horizontally in the direction (left-and-right direction in FIG. 1) in which the carry-in/out station 2 and the processing station 3 are arranged. The transfer section 8 incorporates a transfer arm A2 therein. The transfer arm A2 is configured to be movable horizontally in a longitudinal direction (left-and-right direction in FIG. 1) of the transfer section 8, movable up and down in the vertical direction and pivotable about a vertical axis. The transfer arm A2 is configured to take out the substrate W from the shelf unit 6 and hand it over to a liquid processing unit 100, and also configured to receive the substrate W from the liquid processing unit 100 and return it back into the shelf unit 6.

Liquid Processing Unit

Figure 3:
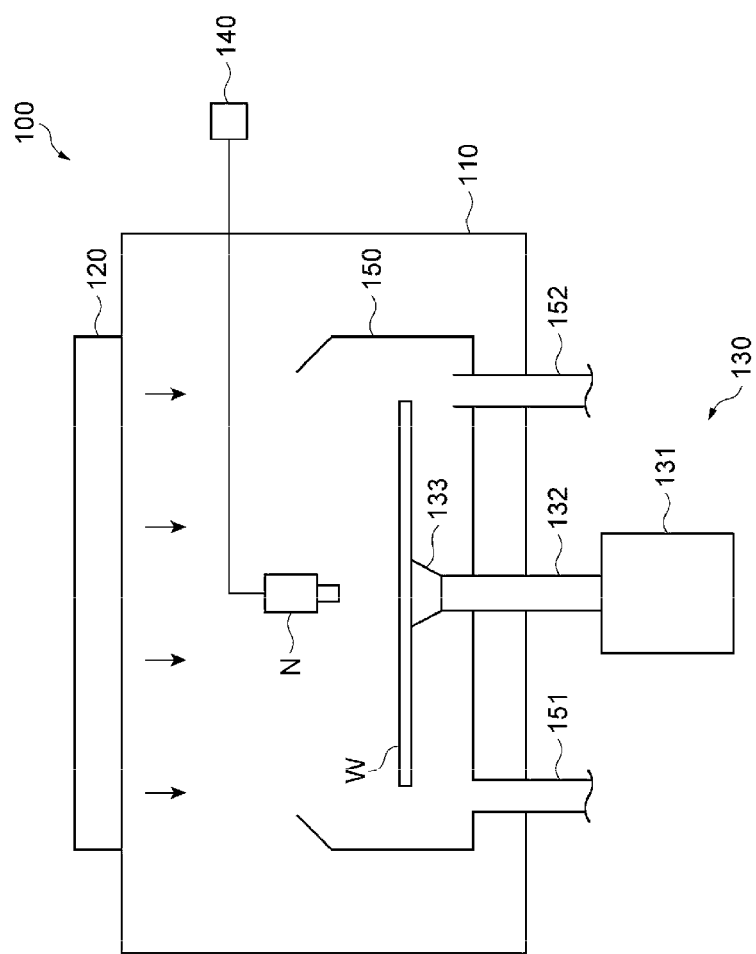
FIG. 3 is a schematic side view illustrating an example of a liquid processing unit.

Hereinafter, the liquid processing unit 100 will be described in detail with reference to FIG. 3 and FIG. 4. The liquid processing unit 100 is configured to perform a predetermined liquid processing (e.g., a processing of removing contaminants or foreign matters, an etching processing, etc.) onto the substrate W. The liquid processing unit 100 may be configured as a single-type cleaning device to clean substrates W one by one through, for example, spin cleaning.

The liquid processing unit 100 includes a chamber 110, an air blower 120, a rotary holder 130, a supply 140 and a cup body 150.

The chamber 110 is a housing configured to allow the substrate W to be carried in and out. A non-illustrated carry-in/out port is formed at a side wall of the chamber 110. The substrate W is carried into the chamber 110 and carried out of the chamber 110 by the transfer arm A2 through the carry-in/out port.

The air blower 120 is provided at a ceiling wall of the chamber 110. The air blower 120 is configured to form a downflow in the chamber 110 based on a signal from the controller Ctr.

The rotary holder 130 includes a driving unit 131, a shaft 132 and a holder 133. The driving unit 131 is configured to rotate the shaft 132 based on an operation signal from the controller Ctr. The driving unit 131 may be a power source such as an electric motor.

The holder 133 is provided at a tip end portion of the shaft 132. The holder 133 is configured to attract and hold a rear surface of the substrate W by, for example, adsorption. That is, the rotary holder 130 may be configured to rotate the substrate W around a central axis (rotation axis) perpendicular to a front surface of the substrate W in an approximately horizontal state.

The supply 140 is configured to supply a plurality of processing liquids of different types from a nozzle N to the front surface of the substrate W. The supply 140 includes liquid sources 141 to 144, valves 145 to 148 and pipes D1 to D5, as shown in FIG. 4.

The liquid source 141 may be configured as a source of a processing liquid L1 (a second processing liquid or a third processing liquid). The processing liquid L1 may be, for example, an acid-based processing liquid. The acid-based processing liquid may include, for example, an SC-2 solution (a mixed solution of hydrochloric acid, hydrogen peroxide and pure water), SPM (a mixed solution of sulfuric acid and a hydrogen peroxide solution), an HF (hydrofluoric acid) solution, a DHF (diluted hydrofluoric acid) solution, an $HNO_3$+HF solution (a mixed solution of nitric acid and hydrofluoric acid) and the like. The liquid source 141 is connected to the nozzle N via the pipes D1 and D5.

The liquid source 142 may be configured as a source of a processing liquid L2 (the second processing liquid or the third processing liquid). The processing liquid L2 may be, for example, an alkali-based processing liquid. The alkali-based processing liquid may include, for example, an SC-1 solution (a mixed solution of ammonia, hydrogen peroxide and deionized water), a hydrogen peroxide solution and the like. The liquid source 142 is connected to the nozzle N via the pipes D2 and D5.

The liquid source 143 may be configured as a source of a processing liquid L3 (a first processing liquid). The processing liquid L3 may be, for example, an organic-based processing liquid. The organic-based processing liquid may include, for example, isopropyl alcohol (IPA) and the like. The liquid source 143 is connected to the nozzle N via the pipes D3 and D5.

The liquid source 144 may be configured as a source of a processing liquid L4. The processing liquid L4 may be, for example, a rinse. The rinse may include, for example, deionized water (DIW), ozone water, carbonated water ($CO_2$ water), ammonia water and the like. The liquid source 144 is connected to the nozzle N via the pipes D4 and D5.

The valves 145 to 148 are provided in the pipes D1 to D4, respectively. Each of the valves 145 to 148 is configured to be opened or closed based on an operation signal from the controller Ctr.

The nozzle N with a discharge opening directed to the surface of the substrate W may be placed above the substrate W. The nozzle N may be configured to be movable in the horizontal direction or vertical direction above the substrate W by a non-illustrated driving source.

Referring back to FIG. 3, the cup body 150 is provided to surround the holder 133. The cup body 150 is configured to collect the processing liquid scattered from an outer periphery of the substrate W when the substrate W is held and rotated by the rotary holder 130. A drain port 151 and an exhaust port 152 are provided at the bottom of the cup body 150. The drain port 151 is configured to drain the processing liquids L1 to L4 collected by the cup body 150 to the outside of the liquid processing unit 100.

The exhaust port 152 is configured to exhaust the downflow formed around the substrate W by the air blower 12 to the outside of the liquid processing unit 100. The exhaust port 152 exhausts, as an exhausts gas, a gas generated around the substrate W when the processing liquids L1 to L4 are supplied to the substrate W and the substrate W is processed with the processing liquids L1 to L4 in the liquid processing unit 100. That is, the exhaust gas includes an acid-based exhaust gas G1 (a second exhaust gas or a third exhaust gas) exhausted from the exhaust port 152 of the liquid processing unit 100 when the substrate W is processed with the processing liquid L1, an alkali-based exhaust gas G2 (the second exhaust gas or the third exhaust gas) exhausted from the exhaust port 152 of the liquid processing unit 100 when the substrate W is processed with the processing liquid L2, and an organic-based exhaust gas G3 (a first exhaust gas) exhausted from the exhaust port 152 of the liquid processing unit 100 when the substrate W is processed with the processing liquid L3. Also, the exhaust gases G1 to G3 exhausted from the exhaust port 152 of the liquid processing unit 100 may contain mist of the processing liquids L1 to L3, respectively.

Exhaust Unit

Hereinafter, the exhaust unit 200 will be described with reference to FIG. 2, FIG. 4 and FIG. 5. Main components of the exhaust unit 200 are placed above the carry-in/out station 2 and the processing station 3 as shown in FIG. 2. The exhaust unit 200 includes individual exhaust pipes 210, 220 and 230, a plurality of main exhaust pipes 240 and a plurality of switching units 300 as shown in FIG. 2, FIG. 4 and FIG. 5.

Figure 2:
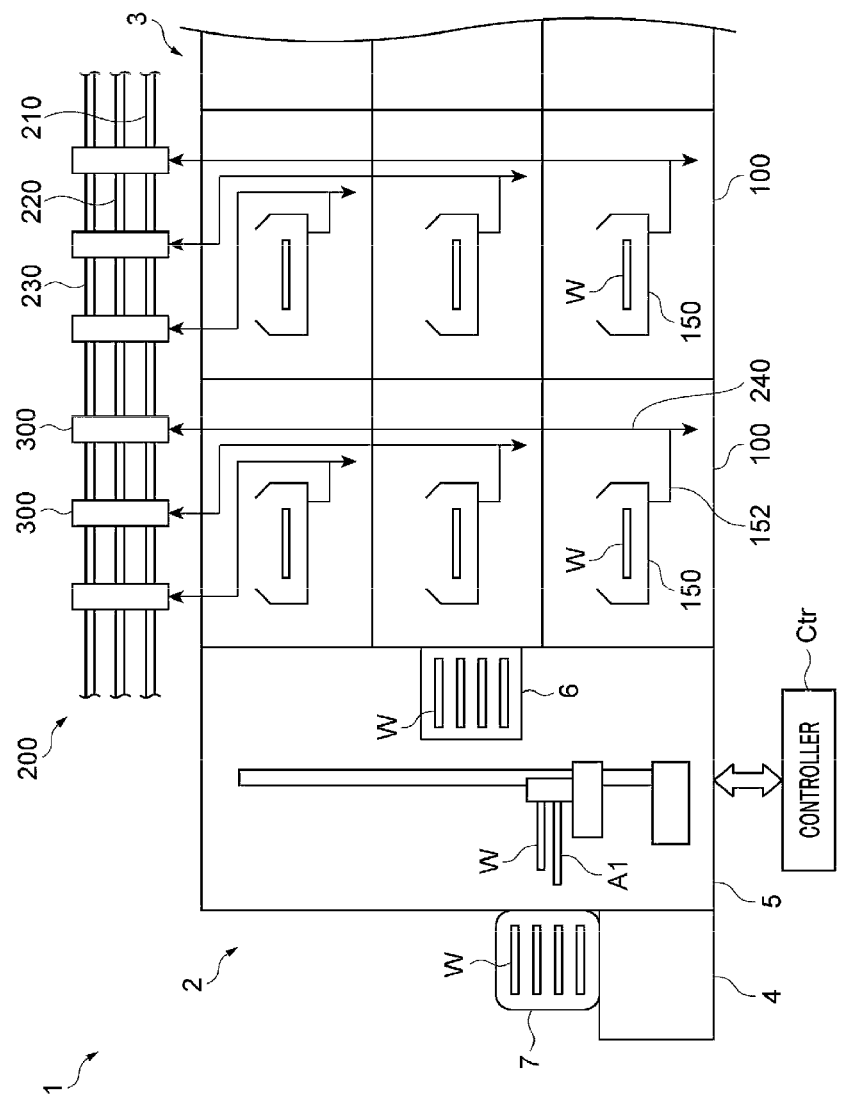
FIG. 2 is a schematic side view illustrating the substrate processing system of FIG. 1.
Figure 4:
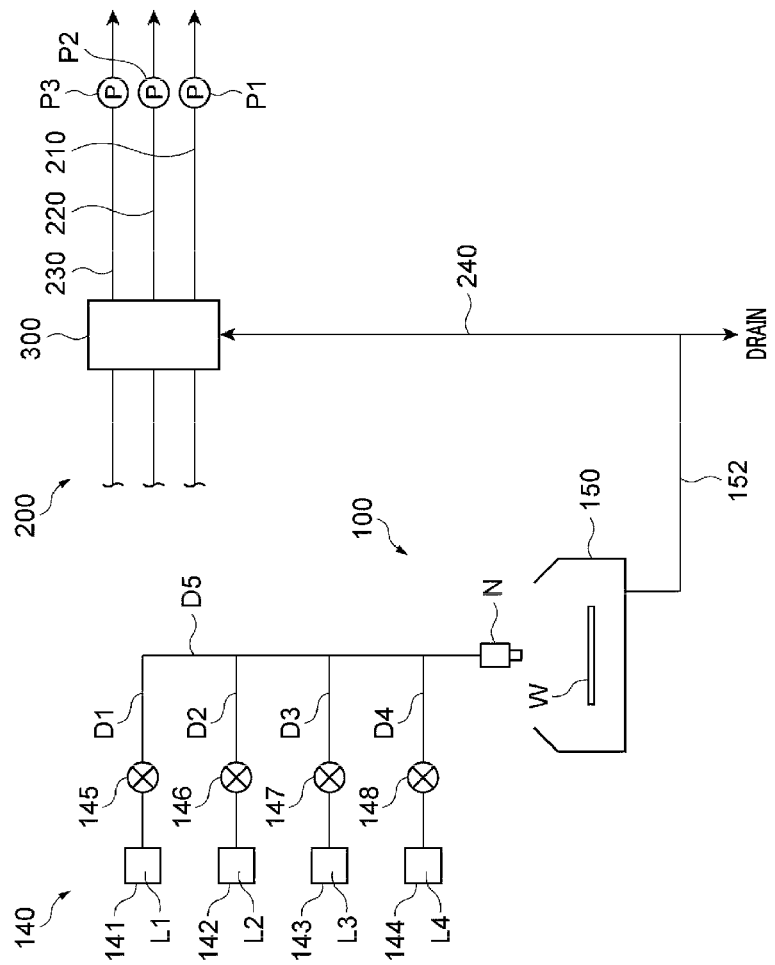
FIG. 4 is a schematic diagram illustrating an example of the liquid processing unit and an exhaust unit.
Figure 5:
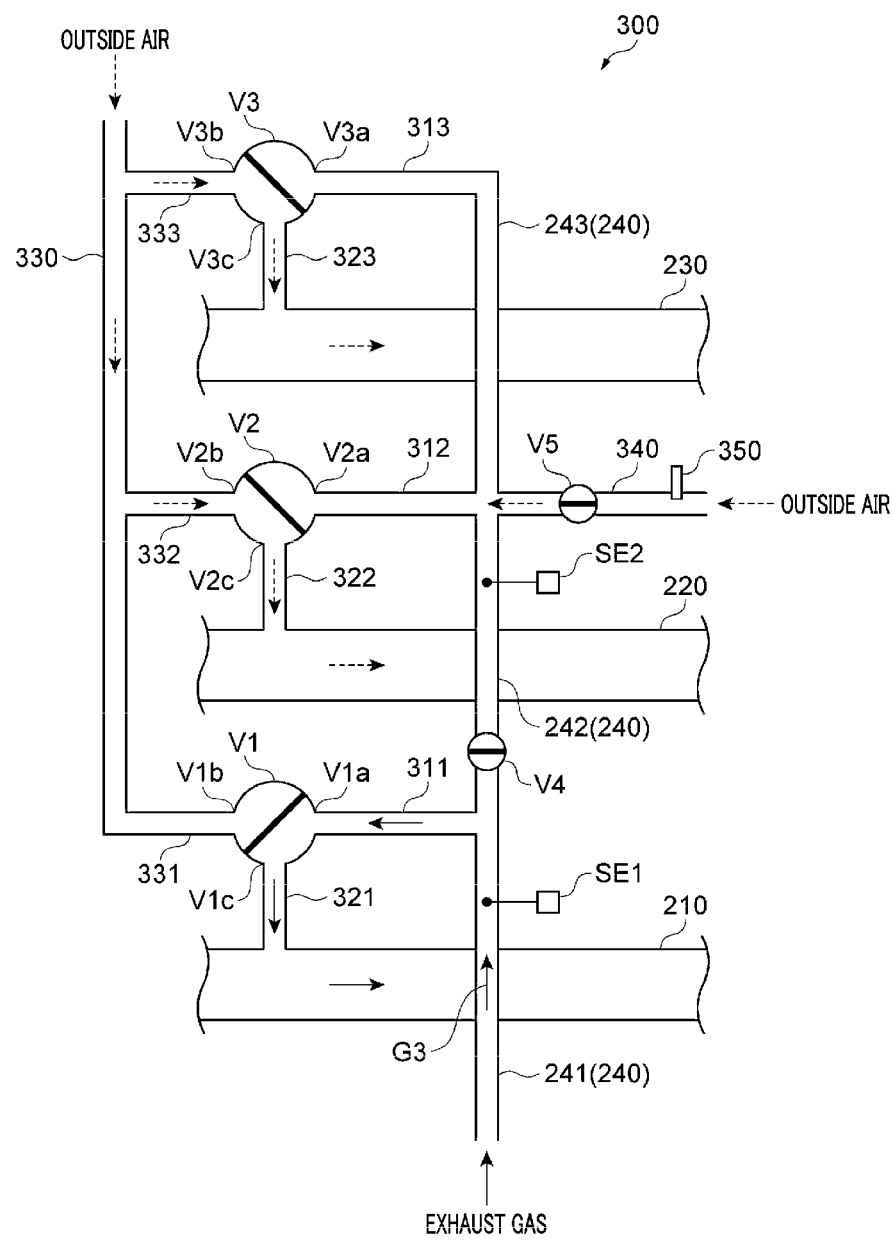
FIG. 5 is a partially enlarged view schematically illustrating the exhaust unit of FIG. 4, and illustrates a state where a main exhaust pipe communicates with an individual exhaust pipe for an organic-based exhaust gas.

The individual exhaust pipes 210, 220 and 230 are placed above the carry-in/out station 2 and the processing station 3 as shown in FIG. 2 and FIG. 4. The individual exhaust pipe 210 is configured as an exhaust path that guides the exhaust gas G3 to the outside of the substrate processing system 1. The individual exhaust pipe 220 is configured as an exhaust path that guides the exhaust gas G2 to the outside of the substrate processing system 1. The individual exhaust pipe 230 is configured as an exhaust path that guides the exhaust gas G1 to the outside of the substrate processing system 1. As shown in FIG. 4, the individual exhaust pipes 210, 220 and 230 are provided with pumps P1 to P3, respectively. That is, the exhaust gases G1 to G3 are sent through the respective individual exhaust pipes 210, 220 and 230 to be exhausted to the outside of the substrate processing system 1.

The plurality of main exhaust pipes 240 respectively corresponds to the plurality of liquid processing units 100 provided in the processing station 3. The plurality of switching units 300 respectively corresponds to the plurality of liquid processing units 100 provided in the processing station 3. That is, one of the plurality of main exhaust pipes 240 is configured to allow the exhaust gas exhausted from one of the plurality of liquid processing units 100 to flow into one of the plurality of switching units 300. All the main exhaust pipes 240 are identical to each other in configuration, and all the switching units 300 are identical to each other in configuration. For this reason, a main exhaust pipe 240 and a switching unit 300 corresponding to a single liquid processing unit 100 will be described, and description of the other main exhaust pipes 240 and the other switching units 300 will be omitted.

The main exhaust pipe 240 extends between the liquid processing unit 100 and the switching unit 300 in the vertical direction as shown in FIG. 2 and FIG. 4. That is, an upstream end portion (lower end portion) of the main exhaust pipe 240 is connected to the exhaust port 152, and a downstream end portion (upper end portion) of the main exhaust pipe 240 reaches the switching unit 300.

The upstream end portion (lower end portion) of the main exhaust pipe 240 is connected to a non-illustrated drain unit. The exhaust gases G1 to G3 may contain mist. Since mist is heavier than a gas, the exhaust gases G1 to G3 may flow upwards within the main exhaust pipe 240, but it is difficult for the mist to flow upwards within the main exhaust pipe 240. The mist is cooled to be liquefied into droplets while the exhaust gases G1 to G3 flow upwards within the main exhaust pipe 240, and the droplets fall down within the main exhaust pipe 240. As a result, the droplets derived from the mist are drained from the drain unit to the outside of the substrate processing system 1. That is, gas-liquid separation is performed in the main exhaust pipe 240.

The downstream end portion of the main exhaust pipe 240 includes a first portion 241, a second portion 242 and a third portion 243 as shown in FIG. 5. The first portion 241, the second portion 242 and the third portion 243 are arranged in series in this order from the upstream side to the downstream side.

The switching unit 300 is placed above the carry-in/out station 2 and the processing station 3 as shown in FIG. 2 and FIG. 4. That is, the switching unit 300 is placed above the liquid processing unit 100. The switching unit 300 is configured to allow the main exhaust pipe 240 to selectively communicate with any one of the individual exhaust pipes 210, 220 and 230. The switching unit 300 includes valves V1 to V5, inlet pipes 311 to 313, outlet pipes 321 to 323, outside air introduction pipes 330 to 333, an outside air introduction pipe 340, a regulator 350 and sensors SE1 and SE2 as shown in FIG. 5.

The valve V1 (first switching mechanism) includes inlet ports V1a and V1b and an outlet port V1c. The valve V1 is configured to operate based on an operation signal from the controller Ctr. The valve V1 is placed between the first portion 241 of the main exhaust pipe 240 and the individual exhaust pipe 210. The valve V1 can switch between a state where the inlet port V1a communicates with the outlet port V1c, but the inlet port V1b does not communicate with the outlet port V1c (see FIG. 5) and a state where the inlet port V1b communicates with the outlet port V1c, but the inlet port V1a does not communicate with the outlet port V1c (see FIG. 8 and FIG. 9).

The valve V2 (second switching mechanism) includes inlet ports V2a and V2b and an outlet port V2c. The valve V2 is configured to operate based on an operation signal from the controller Ctr. The valve V2 is placed between the second portion 242 of the main exhaust pipe 240 and the individual exhaust pipe 220. The valve V2 can switch between a state where the inlet port V2a communicates with the outlet port V2c, but the inlet port V2b does not communicate with the outlet port V2c (see FIG. 8) and a state where the inlet port V2b communicates with the outlet port V2c, but the inlet port V2a does not communicate with the outlet port V2c (see FIG. 5 and FIG. 9).

The valve V3 (fifth switching mechanism) includes inlet ports V3a and V3b and an outlet port V3c. The valve V3 is configured to operate based on an operation signal from the controller Ctr. The valve V3 is placed between the third portion 243 of the main exhaust pipe 240 and the individual exhaust pipe 230. The valve V3 can switch between a state where the inlet port V3a communicates with the outlet port V3c, but the inlet port V3b does not communicate with the outlet port V3c (see FIG. 9) and a state where the inlet port V3b communicates with the outlet port V3c, but the inlet port V3a does not communicate with the outlet port V3c (see FIG. 5 and FIG. 8).

The valve V4 (third switching mechanism) is configured to be opened or closed based on an operation signal from the controller Ctr. The valve V4 can switch between an open state where the flow of the exhaust gas is allowed and a closed state where the flow of the exhaust gas is blocked. The valve V4 is placed between the first portion 241 and the second portion 242 of the main exhaust pipe 240. In other words, the second portion 242 and the third portion 243 of the main exhaust pipe 240 are located on the downstream side of the valve V4.

The valve V5 (fourth switching mechanism) is configured to be opened or closed based on an operation signal from the controller Ctr. The valve V5 can switch between an open state where the flow of outside air is allowed and a closed state where the flow of outside air is blocked. The valve V5 is placed in the outside air introduction pipe 340.

The inlet pipe 311 is extended to connect the first portion 241 of the main exhaust pipe 240 to the inlet port V1a of the valve V1. The inlet pipe 312 is extended to connect the second portion 242 of the main exhaust pipe 240 to the inlet port V2a of the valve V2. The inlet pipe 313 is extended to connect the third portion 243 of the main exhaust pipe 240 to the inlet port V3a of the valve V3.

The outlet pipe 321 is extended to connect the individual exhaust pipe 210 to the outlet port V1c of the valve V1. The outlet pipe 322 is extended to connect the individual exhaust pipe 220 to the outlet port V2c of the valve V2. The outlet pipe 323 is extended to connect the individual exhaust pipe 230 to the outlet port V3c of the valve V3.

The outside air introduction pipes 330 to 333 are configured to supply the outside air to the individual exhaust pipes 210, 220 and 230, respectively. The outside air introduction pipe 330 includes an upper end portion in fluid connection with the outside air. The outside air introduction pipe 331 is extended to connect the outside air introduction pipe 330 to the inlet port V1b of the valve V1. The outside air introduction pipe 332 is extended to connect the outside air introduction pipe 330 to the inlet port V2b of the valve V2. The outside air introduction pipe 333 is extended to connect the outside air introduction pipe 330 to the inlet port V3b of the valve V3.

The outside air introduction pipe 340 is configured to supply the outside air to the second portion 242 of the main exhaust pipe 240. The outside air introduction pipe 340 is extended to connect an upper end portion thereof in fluid connection with the outside air to the second portion 242 of the main exhaust pipe 240.

The regulator 350 is provided on the upstream side of the valve V5 in the outside air introduction pipe 340. The regulator 350 is configured to operate based on an operation signal from the controller Ctr. The regulator 350 is configured to regulate a flow rate of the outside air flowing in the outside air introduction pipe 340 to regulate a pressure in the second portion 242 of the main exhaust pipe 240 communicating with the outside air introduction pipe 340 by, for example, changing an opening area of the outside air introduction pipe 340.

The sensor SE1 (first sensor) is configured to measure a pressure in the first portion 241 of the main exhaust pipe 240. The sensor SE1 is configured to transmit data of the measured pressure to the controller Ctr. The sensor SE2 (second sensor) is configured to measure a pressure in the second portion 242 of the main exhaust pipe 240. The sensor SE2 is configured to transmit data of the measured pressure to the controller Ctr.

Details of Controller

Figure 6:
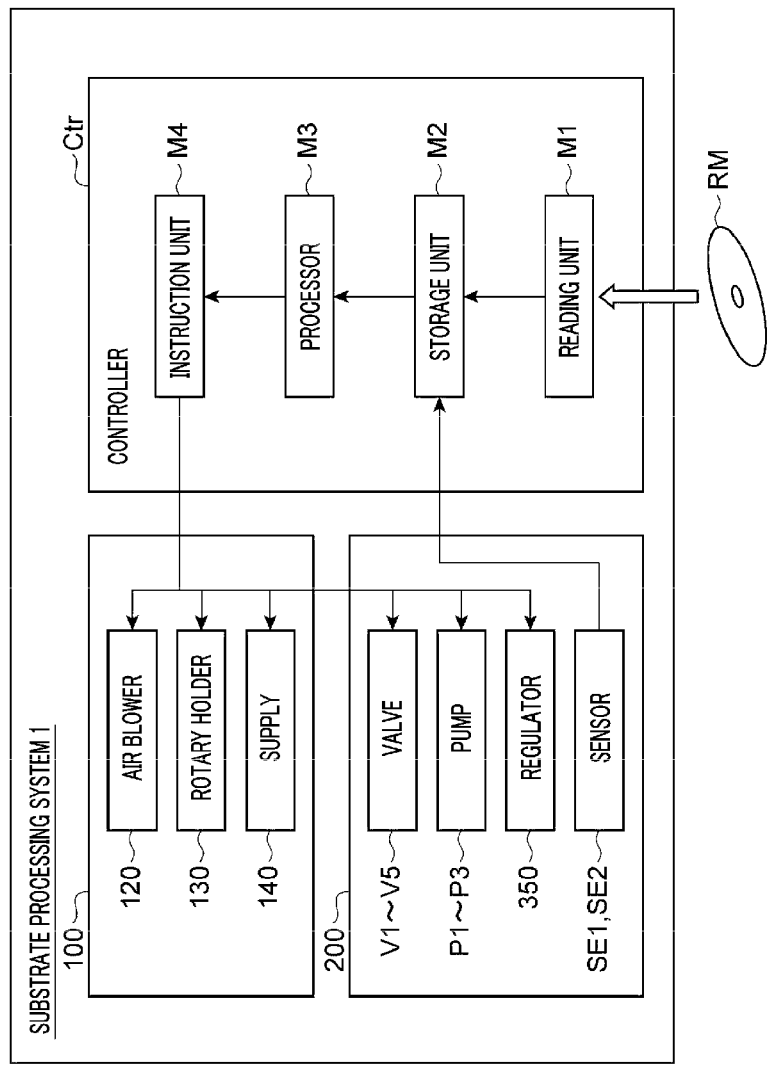
FIG. 6 is a block diagram illustrating main components of the substrate processing system.

The controller Ctr is configured to partially or entirely control the substrate processing system 1. The controller Ctr includes, as functional modules, a reading unit M1, a storage unit M2, a processor M3 and an instruction unit M4 as illustrated in FIG. 6. Although the controller Ctr has been described to be divided into these functional modules according to respective functions for the convenience in description, it does not necessarily mean that the hardware constituting the controller Ctr is divided into these modules. Each functional module is not limited to being implemented by execution of a program, but may be implemented by a dedicated electric circuit (e.g., a logic circuit) or an application specific integrated circuit (ASIC) into which the functional modules are integrated.

The reading unit M1 is configured to read a program from a computer-readable recording medium RM. The recording medium RM stores therein a program for operating each component of the substrate processing system 1. The recording medium RM may be, for example, a semiconductor memory, an optical recording disk, a magnetic recording disk, or a magneto-optical recording disk. In the following, each component of the substrate processing system 1 may include the air blower 120, the rotary holder 130, the supply 140, the valves V1 to V5, pumps P1 to P3 and the regulator 350.

The storage unit M2 is configured to store various kinds of data therein. The storage unit M2 may store therein, for example, the program read out from the recording medium RM in the reading unit M1, setting data inputted by an operator through an external input device (not shown), and the like. Further, the storage unit M2 may store therein processing conditions (processing recipes) for processing the substrate W. Furthermore, the storage unit M2 may store therein, for example, the pressure data obtained by the sensors SE1 and SE2.

The processor M3 is configured to process various kinds of data. The processor M3 may generate, for example, a signal for operating each component of the substrate processing system 1 based on various kinds of data stored in the storage unit M2. The processor M3 may calculate, for example, an opening area of the outside air introduction pipe 340 at which the second portion 242 has a higher pressure than the first portion 241 based on the pressure data obtained by the sensors SE1 and SE2. The processor M3 may generate a signal for operating the regulator 350 based on the calculated opening area.

The instruction unit M4 is configured to transmit the operation signal generated by the processor M3 to each component of the substrate processing system 1.

Figure 7:
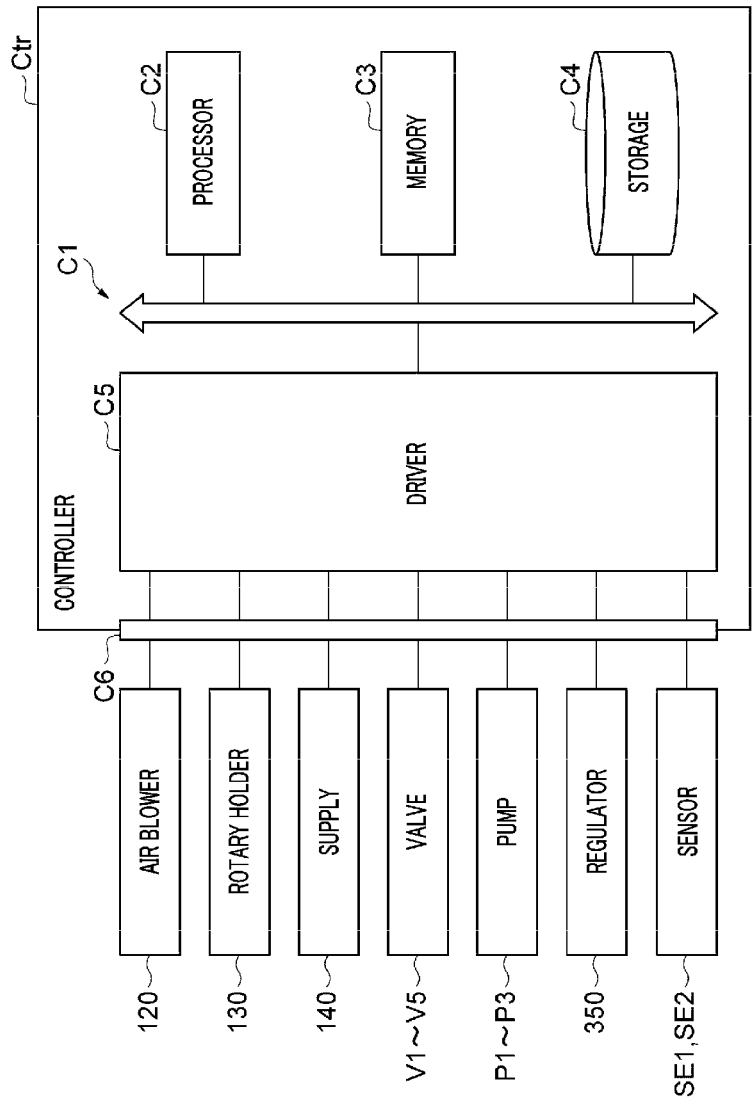
FIG. 7 is a schematic diagram illustrating an example of a hardware structure of a controller.

The hardware of the controller Ctr may be composed of, for example, one or more control computers. The controller Ctr may include a circuit C1 as a hardware component as illustrated in FIG. 7. The circuit C1 may be composed of electronic circuit elements (circuitry). The circuit C1 may include a processor C2, a memory C3, a storage C4, a driver C5 and an input/output port C6.

The processor C2 may be configured to implement each of the above-described functional modules by executing a program in cooperation with at least one of the memory C3 and the storage C4 and performing an input/output of a signal through the input/output port C6. The memory C3 and the storage C4 may function as the storage unit M2. The driver C5 may be a circuit configured to drive the components of the substrate processing system 1 individually. The input/output port C6 may be configured to mediate an input/output of a signal between the driver C5 and each component of the substrate processing system 1.

The substrate processing system 1 may be equipped with one controller Ctr, or may be equipped with a controller group (a control unit) including a plurality of controllers Ctr. When the substrate processing system 1 includes the controller group, each of the above-described functional modules may be implemented by one controller Ctr, or may be implemented by a combination of two or more controllers Ctr. When the controller Ctr is composed of a plurality of computers (circuits C1), each of the above-described functional modules may be implemented by one computer (circuit C1), or may be implemented by a combination of two or more computers (circuits C1). The controller Ctr may include a plurality of processors C2. In this case, each of the above-described functional modules may be implemented by one processor C2, or may be implemented by a combination of two or more processors C2.

Substrate Processing Method

Figure 8:
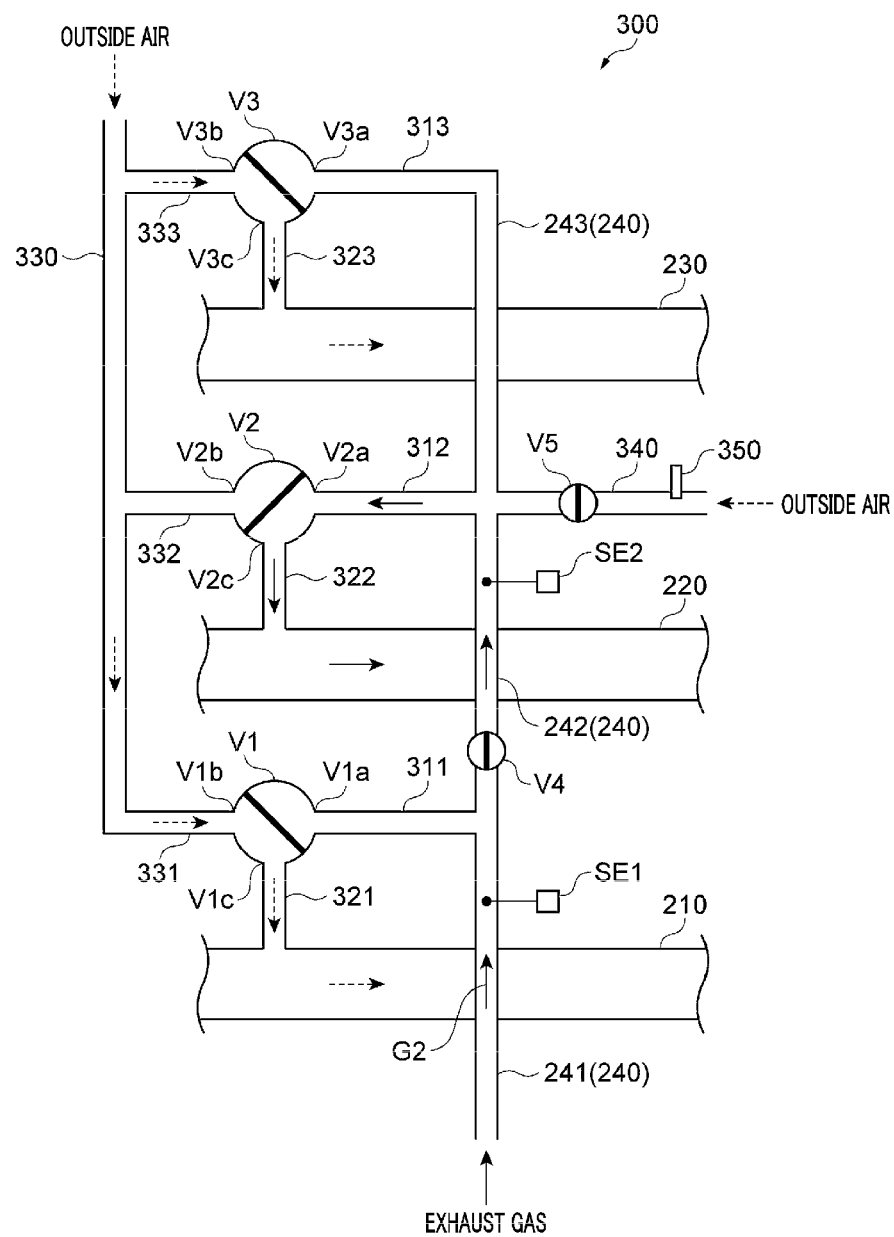
FIG. 8 is a partially enlarged view schematically illustrating the exhaust unit of FIG. 4, and illustrates a state where the main exhaust pipe communicates with an individual exhaust pipe for an alkali-based exhaust gas.

Hereinafter, a method of processing the substrate W will be described with reference to FIG. 1 to FIG. 5, FIG. 8 and FIG. 9. As shown in FIG. 8, in an initial state of the switching unit 300, the valves V1 to V5 are in respective states as described below.

Valve V1: State where the inlet port V1b communicates with the outlet port V1c (state where the first portion 241 does not communicate with the individual exhaust pipe 210)

Valve V2: State where the inlet port V2a communicates with the outlet port V2c (state where the second portion 242 communicates with the individual exhaust pipe 220)

Valve V3: State where the inlet port V3b communicates with the outlet port V3c (state where the third portion 243 does not communicate with the individual exhaust pipe 230)

Valve V4: Open state

Valve V5: Closed state

First, the controller Ctr controls the transfer arms A1 and A2 to transfer the substrate W from the carrier 7 to the liquid processing unit 100 (see FIG. 1 and FIG. 2). Then, the substrate W is held by the rotary holder 130 of the liquid processing unit 100 (see FIG. 3). Thereafter, the controller Ctr controls the rotary holder 130 to rotate the substrate W at a predetermined rotation number. In this state, the controller Ctr controls the supply 140 to supply, for example, the alkali-based processing liquid L2 from the nozzle N onto the central portion of the front surface of the substrate W (see FIG. 4).

When the substrate W is rotated, the processing liquid L2 supplied onto the front surface of the substrate W flows throughout the surface of the substrate W from the central portion toward the outer periphery of the substrate W and then is scattered from the outer periphery to the outside. For this reason, while the processing liquid L2 is supplied from the nozzle N, a liquid film of the processing liquid L2 is formed on the front surface of the substrate W. Accordingly, the front surface of the substrate W is processed with the processing liquid L2.

The processing liquid L2 scattered from the outer periphery of the substrate W to the outside is collected in the cup body 150. A gas generated when the substrate W is processed with the processing liquid L2 is exhausted from the exhaust port 152 of the liquid processing unit 100. The alkali-based exhaust gas G2 exhausted from the liquid processing unit 100 is introduced into the switching unit 300 through the main exhaust pipe 240 (see FIG. 4).

The exhaust gas G2 introduced into the switching unit 300 flows through the first portion 241 and the second portion 242 of the main exhaust pipe 240, the inlet pipe 312, the valve V2 and the outlet pipe 322 and then is exhausted from the individual exhaust pipe 220 to the outside of the substrate processing system 1 (see FIG. 8). The outside air introduced from the outside air introduction pipe 330 flows through the outside air introduction pipe 331, the valve V1 and the outlet pipe 321 and then is exhausted from the individual exhaust pipe 210 to the outside of the substrate processing system 1 (see FIG. 8). The outside air introduced from the outside air introduction pipe 330 flows through the outside air introduction pipe 333, the valve V3 and the outlet pipe 323 and then is exhausted from the individual exhaust pipe 230 to the outside of the substrate processing system 1 (see FIG. 8). Since the valve V5 is in the closed state, the outside air is not introduced into the second portion 242 of the main exhaust pipe 240 from the outside air introduction pipe 340.

Then, the controller Ctr controls the supply 140 to supply the processing liquid L4 (rinse) from the nozzle N onto the central portion of the front surface of the substrate W (see FIG. 4). Accordingly, the processing liquid L2 remaining on the front surface of the substrate W is washed off by the processing liquid L4.

Thereafter, the controller Ctr controls the switching unit 300 to switch the valves V1 to V5 to respective states as described below (see FIG. 9).

Valve V1: State where the inlet port V1b communicates with the outlet port V1c (state where the first portion 241 does not communicate with the individual exhaust pipe 210)

Valve V2: State where the inlet port V2b communicates with the outlet port V2c (state where the second portion 242 does not communicate with the individual exhaust pipe 220)

Valve V3: State where the inlet port V3a communicates with the outlet port V3c (state where the third portion 243 communicates with the individual exhaust pipe 230)

Valve V4: Open state

Valve V5: Closed state

Then, in a state where the substrate W is rotated by the rotary holder 130, the controller Ctr controls the supply 140 to supply, for example, the acid-based processing liquid L1 from the nozzle N onto the central portion of the surface of the substrate W (see FIG. 4).

When the substrate W is rotated, the processing liquid L1 supplied onto the front surface of the substrate W flows throughout the front surface of the substrate W from the central portion toward the outer periphery of the substrate W and then is scattered from the outer periphery to the outside. For this reason, while the processing liquid L1 is supplied from the nozzle N, a liquid film of the processing liquid L1 is formed on the front surface of the substrate W. Accordingly, the front surface of the substrate W is processed with the processing liquid L1.

The processing liquid L1 scattered from the outer periphery of the substrate W to the outside is collected in the cup body 150. A gas generated when the substrate W is processed with the processing liquid L1 is exhausted from the exhaust port 152 of the liquid processing unit 100. The acid-based exhaust gas G1 exhausted from the liquid processing unit 100 is introduced into the switching unit 300 through the main exhaust pipe 240 (see FIG. 4).

Figure 9:
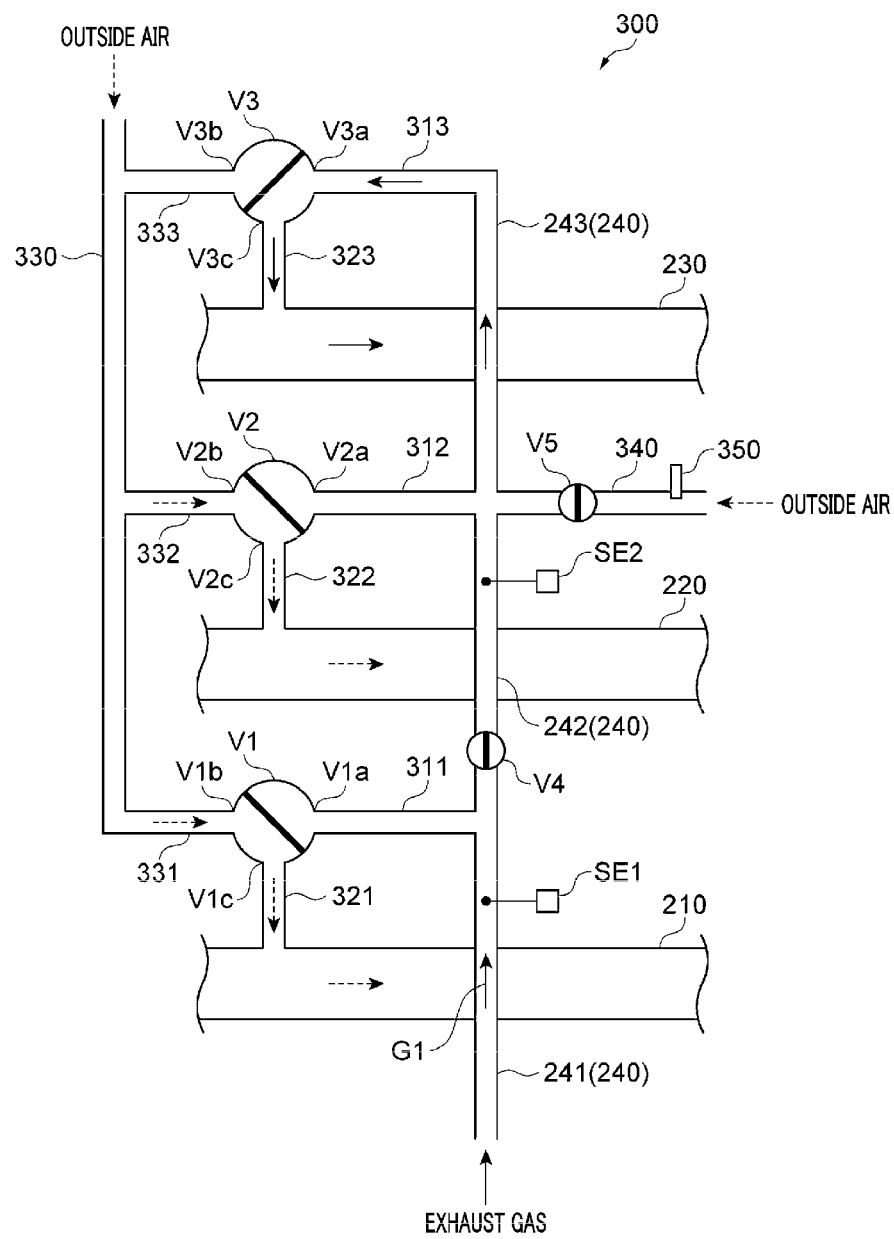
FIG. 9 is a partially enlarged view schematically illustrating the exhaust unit of FIG. 4, and illustrates a state where the main exhaust pipe communicates with an individual exhaust pipe for an acid-based exhaust gas.

The exhaust gas G1 introduced into the switching unit 300 flows through the first portion 241, the second portion 242 and the third portion 243 of the main exhaust pipe 240, the inlet pipe 313, the valve V3 and the outlet pipe 323 and then is exhausted from the individual exhaust pipe 230 to the outside of the substrate processing system 1 (see FIG. 9). The outside air introduced from the outside air introduction pipe 330 flows through the outside air introduction pipe 331, the valve V1 and the outlet pipe 321 and then is exhausted from the individual exhaust pipe 210 to the outside of the substrate processing system 1 (see FIG. 9). The outside air introduced from the outside air introduction pipe 330 flows through the outside air introduction pipe 332, the valve V2 and the outlet pipe 322 and then is exhausted from the individual exhaust pipe 220 to the outside of the substrate processing system 1 (see FIG. 9). Since the valve V5 is in the closed state, the outside air is not introduced into the second portion 242 of the main exhaust pipe 240 from the outside air introduction pipe 340.

Then, the controller Ctr controls the supply 140 to supply the processing liquid L4 (rinse) from the nozzle N onto the central portion of the front surface of the substrate W (see FIG. 4). Accordingly, the processing liquid L1 remaining on the front surface of the substrate W is washed off by the processing liquid L4.

Thereafter, the controller Ctr controls the switching unit 300 to switch the valves V1 to V5 to respective states as described below (see FIG. 5).

Valve V1: State where the inlet port V1a communicates with the outlet port V1c (state where the first portion 241 communicates with the individual exhaust pipe 210)

Valve V2: State where the inlet port V2b communicates with the outlet port V2c (state where the second portion 242 does not communicate with the individual exhaust pipe 220)

Valve V3: State where the inlet port V3b communicates with the outlet port V3c (state where the third portion 243 does not communicate with the individual exhaust pipe 230)

Valve V4: Closed state

Valve V5: Open state

Then, in a state where the substrate W is rotated by the rotary holder 130, the controller Ctr controls the supply 140 to supply, for example, the organic-based processing liquid L3 from the nozzle N onto the central portion of the front surface of the substrate W (see FIG. 4).

When the substrate W is rotated, the processing liquid L3 supplied onto the front surface of the substrate W flows throughout the front surface of the substrate W from the central portion toward the outer periphery of the substrate W and then is scattered from the outer periphery to the outside. For this reason, while the processing liquid L3 is supplied from the nozzle N, a liquid film of the processing liquid L3 is formed on the front surface of the substrate W. Accordingly, the front surface of the substrate W is processed with the processing liquid L3.

The processing liquid L3 scattered from the outer periphery of the substrate W to the outside is collected in the cup body 150. A gas generated when the substrate W is processed with the processing liquid L3 is exhausted from the exhaust port 152 of the liquid processing unit 100. The organic-based exhaust gas G3 exhausted from the liquid processing unit 100 is introduced into the switching unit 300 through the main exhaust pipe 240 (see FIG. 4).

The exhaust gas G3 introduced into the switching unit 300 flows through the first portion 241 of the main exhaust pipe 240, the inlet pipe 311, the valve V1 and the outlet pipe 321 and then is exhausted from the individual exhaust pipe 210 to the outside of the substrate processing system 1 (see FIG. 5). The outside air introduced from the outside air introduction pipe 330 flows through the outside air introduction pipe 332, the valve V2 and the outlet pipe 322 and then is exhausted from the individual exhaust pipe 220 to the outside of the substrate processing system 1 (see FIG. 5). The outside air introduced from the outside air introduction pipe 330 flows through the outside air introduction pipe 333, the valve V3 and the outlet pipe 323 and then is exhausted from the individual exhaust pipe 230 to the outside of the substrate processing system 1 (see FIG. 5).

Since the valve V4 is in the closed state and the valve V5 is in the open state, the outside air is introduced into the second portion 242 of the main exhaust pipe 240 from the outside air introduction pipe 340. Accordingly, a pressure in the second portion 242 may be higher than a pressure in the first portion 241. Otherwise, based on the pressures measured by the sensors SE1 and SE2, the controller Ctr may control the regulator 350 to change the opening area of the outside air introduction pipe 340 such that the pressure in the second portion 242 is higher than the pressure in the first portion 241.

Then, the controller Ctr controls the rotary holder 130 to rotate the substrate W at a predetermined rotation number. Accordingly, the front surface of the substrate W is dried. Thereafter, the controller Ctr controls the transfer arms A1 and A2 to transfer the dried substrate W from the liquid processing unit 100 to the carrier 7 (see FIG. 1 and FIG. 2). Thus, the processing of the substrate W is completed.

Effects

According to the above-described exemplary embodiment, the valve V4 is placed between the first portion 241 and the second portion 242 of the main exhaust pipe 240. Therefore, when the exhaust gas G3 is exhausted from the liquid processing unit 100, by allowing the valve V4 to be in the closed state, it is difficult for the exhaust gas G3 to flow toward the second portion 242 located on the downstream side of the valve V4. Also, according to the above-described exemplary embodiment, when the exhaust gas G3 is exhausted from the liquid processing unit 100, the outside air is introduced into the second portion 242 from the outside air introduction pipe 340 via the valve V5. For this reason, even if there is a slight gap in the valve V4 due to the structure of the valve V4 (e.g., dimensional accuracy), the flow of the exhaust gas G3 in the second portion 242 through the gap is suppressed by the outside air introduced from the outside air introduction pipe 340. Therefore, it is difficult for the exhaust gas G3 to reach the individual exhaust pipes 220 and 230. As a result, when the substrate is processed in the liquid processing unit 100 using the plurality of types of processing liquids, it is possible to suppress the introduction of the exhaust gas G3 exhausted from the liquid processing unit 100 into the individual exhaust pipes 220 and 230 different from the individual exhaust pipe 210 corresponding to the exhaust gas G3.

According to the above-described exemplary embodiment, it is difficult for the organic-based exhaust gas G3 to be introduced into the individual exhaust pipes 220 and 230. For this reason, it is possible to suppress the volatile organic compound from being mixed into the acid-based exhaust gas or alkali-based exhaust gas. For this reason, it is possible to suppress air pollution caused by the gases exhausted through the individual exhaust pipes 220 and 230.

According to the above-described exemplary embodiment, the pressure in the second portion 242 may be set to be higher than the pressure in the first portion 241. In this case, even if there is the slight gap in the valve V4, the exhaust gas G3 hardly flows toward the second portion 242 through the gap. For this reason, it is very difficult for the exhaust gas G3 to reach the individual exhaust pipes 220 and 230.

According to the above-described exemplary embodiment, the regulator 350 may regulate the amount of outside air introduced into the second portion 242 such that the pressure in the second portion 242 is higher than the pressure in the first portion 241 based on the pressures measured by the sensors SE1 and SE2. In this case, for example, even if the pressure in the first portion 241 is changed due to a change in processing conditions of the liquid processing unit 100, the pressures in the second portion 242 and the third portion 243 are regulated by the regulator 350 such that the pressure in the second portion 242 is higher than the pressure in the first portion 241. For this reason, it is possible to suppress the introduction of the exhaust gas G3 into the second portion 242 regardless of the pressure change in the first portion 241.

According to the above-described exemplary embodiment, the switching unit 300 is placed above the liquid processing unit 100. For this reason, if the gas exhausted from the liquid processing unit 100 contains the mist, the exhaust gas reaches the switching unit 300 after the mist is separated from the gas. Therefore, it is possible to suppress the attachment of contaminants or foreign matters caused by the mist to the switching unit 300.

MODIFICATION EXAMPLES

It should be noted that the disclosure of the present specification is illustrative in all aspects and is not anyway limiting. The above-described exemplary embodiment may be omitted, replaced and modified in various ways without departing from the scope and the spirit of claims.

Figure 10:
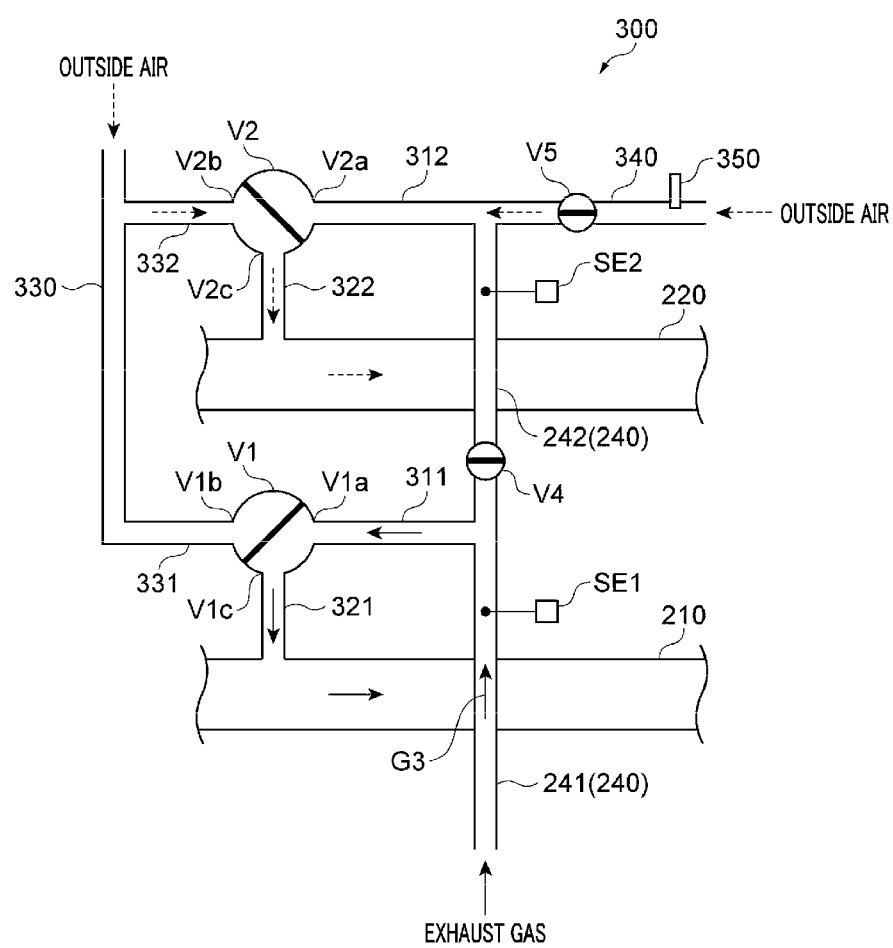
FIG. 10 is a schematic diagram illustrating another example of the exhaust unit.

(1) If there are two types of processing liquids for processing the substrate W (e.g., any two of the acid-based processing liquid L1, the alkali-based processing liquid L2 and the organic-based processing liquid L3), the exhaust unit 200 may not include the individual exhaust pipe 230 as shown in FIG. 10. Accordingly, the switching unit 300 may not include the third portion 243, the inlet pipe 313, the outside air introduction pipe 333, the outlet pipe 323 and the valve V3. If there are four or more types of processing liquids for processing the substrate W, the exhaust unit 200 may include the individual exhaust pipe and its attendant members, which are not illustrated in the drawings, depending on the number of types of processing liquids.

Figure 11:
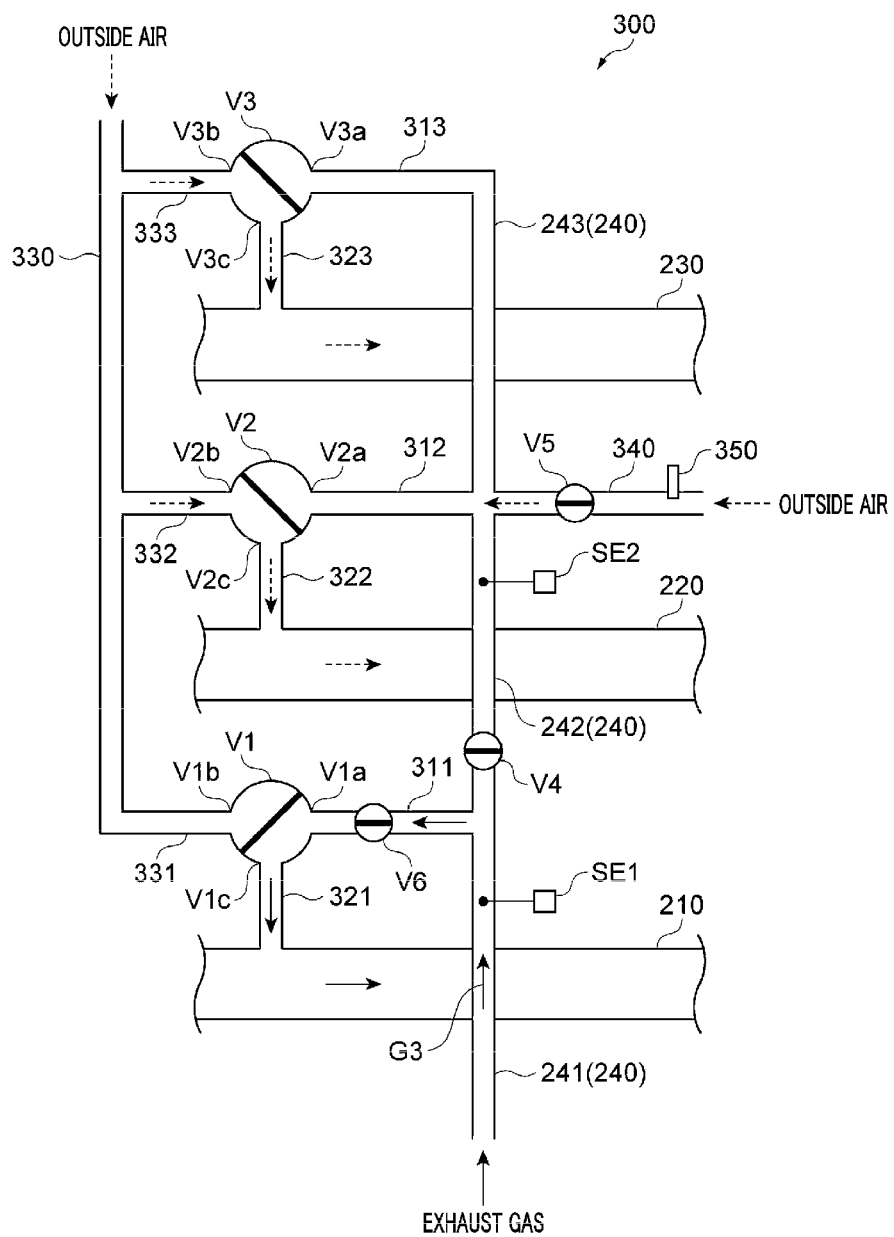
FIG. 11 is a schematic diagram illustrating yet another example of the exhaust unit.

(2) As shown in FIG. 11, the switching unit 300 may further include a valve V6 (sixth switching mechanism) provided in the inlet pipe 311. The valve V6 is configured to be opened or closed based on an operation signal from the controller Ctr. The valve V6 can switch between an open state where the flow of the exhaust gas is allowed and a closed state where the flow of the exhaust gas is blocked. In this case, since the valve V6 is placed between the first portion 241 and the valve V1, the valve V6 is allowed to be in the closed state when the exhaust gases G1 and G2 are exhausted from the liquid processing unit 100. Thus, it is difficult for the exhaust gas G3 to flow backwards from the individual exhaust pipe 210 via the valve V1. For this reason, it is more difficult for the exhaust gas G3 to reach the individual exhaust pipes 220 and 230.

Figure 12:
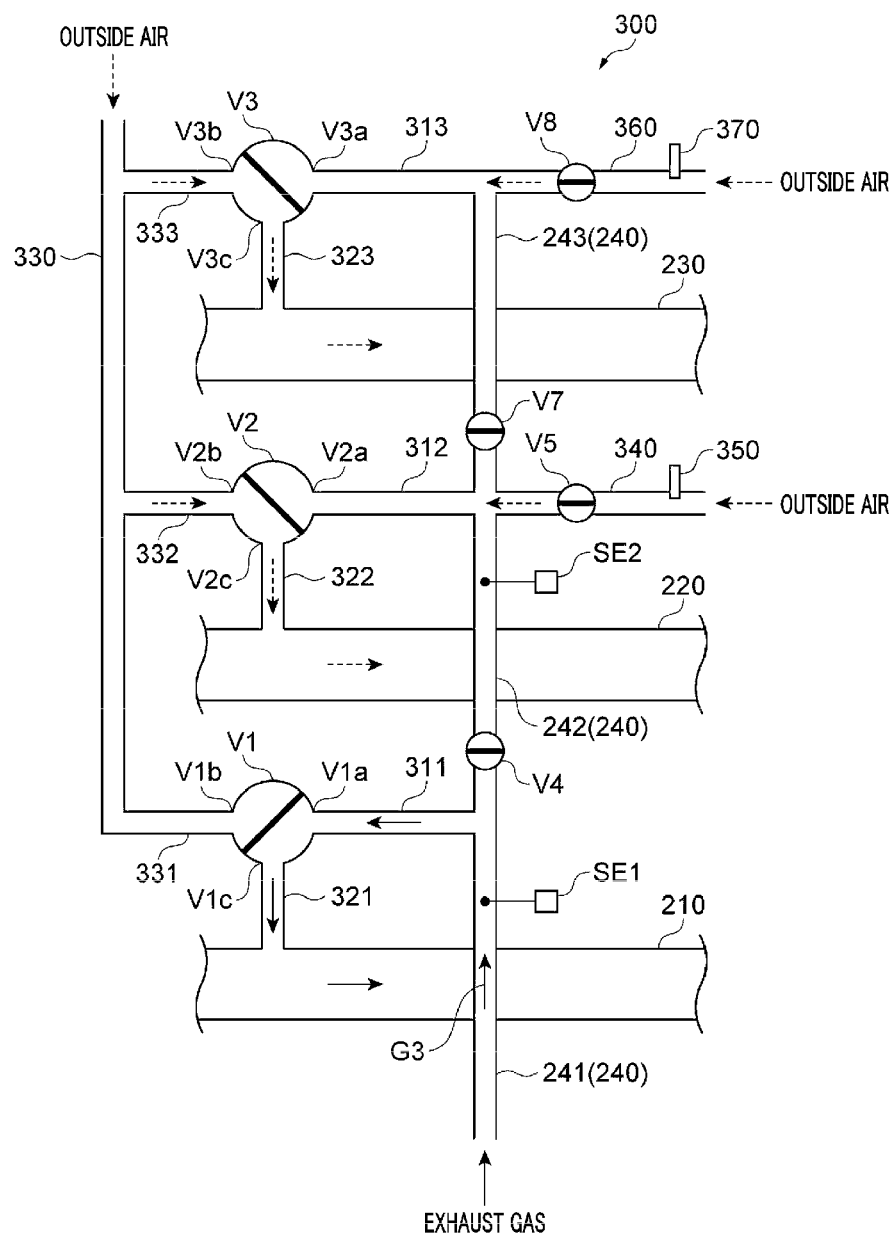
FIG. 12 is a schematic diagram illustrating still yet another example of the exhaust unit.

(3) As shown in FIG. 12, the switching unit 300 may further include a valve V7 provided in the third portion 243. The valve V7 is configured to be opened or closed based on an operation signal from the controller Ctr. The valve V7 can switch between an open state where the flow of the exhaust gas is allowed and a closed state where the flow of the exhaust gas is blocked. In this case, the valve V7 is allowed to be in the closed state when the exhaust gas G3 is exhausted from the liquid processing unit 100. Thus, it is more difficult for the exhaust gas G3 to reach the individual exhaust pipe 230.

As shown in FIG. 12, the switching unit 300 may further include an outside air introduction pipe 360 connected to the third portion 243 and a valve V8 provided in the outside air introduction pipe 360. The outside air introduction pipe 360 is configured to supply the outside air into the third portion 243. The valve V8 is configured to be opened or closed based on an operation signal from the controller Ctr. The valve V8 can switch between an open state where the flow of the outside air is allowed and a closed state where the flow of the outside air is blocked. In this case, the valve V8 is allowed to be in the open state when the exhaust gas G3 is exhausted from the liquid processing unit 100. Thus, the flow of the exhaust gas G3 in the third portion 243 is suppressed by the outside air introduced from the outside air introduction pipe 360.

As shown in FIG. 12, the switching unit 300 may further include a regulator 370 provided on the upstream side of the valve V8 in the outside air introduction pipe 360. The regulator 370 is configured to operate based on an operation signal from the controller Ctr like the regulator 350. The regulator 370 is configured to regulate a flow rate of the outside air flowing in the outside air introduction pipe 360 and regulate a pressure in the third portion 243 of the main exhaust pipe 240 communicating with the outside air introduction pipe 360 by, for example, changing an opening area of the outside air introduction pipe 360. In this case, an opening area of the outside air introduction pipe 360 may be regulated by the regulator 370 such that the pressure in the third portion 243 to be higher than the pressure in the first portion 241. Although not illustrated in the drawings, the switching unit 300 may further include a sensor configured to measure the pressure in the third portion 243 of the main exhaust pipe 240. Based on the pressures measured by the sensor and the sensor SE1, the controller Ctr may control the regulator 370 to change the opening area of the outside air introduction pipe 360 such that the pressure in the third portion 243 to be higher than the pressure in the first portion 241.

(4) After the regulator 350 is controlled by the controller Ctr such that the opening area of the outside air introduction pipe 340 to have a predetermined size, the opening area may not be further regulated by the regulator 350. Otherwise, based on the pressures measured by the sensors SE1 and SE2, the regulator 350 may regulate the opening area of the outside air introduction pipe 340 continuously or at a predetermined time interval.

OTHER EXAMPLES

Example 1. A substrate processing apparatus includes a liquid processing unit configured to supply, onto a front surface of a substrate, individual multiple processing liquids including a first processing liquid and a second processing liquid different from the first processing liquid; and an exhaust unit configured to exhaust an exhaust gas exhausted from the liquid processing unit to an outside, the exhaust gas including a first exhaust gas exhausted from the liquid processing unit when the substrate is processed with the first processing liquid and a second exhaust gas exhausted from the liquid processing unit when the substrate is processed with the second processing liquid. The exhaust unit includes a main exhaust pipe configured to allow the exhaust gas to flow therein, the main exhaust pipe including a first portion located on an upstream side and a second portion located on a downstream side of the first portion; a first individual exhaust pipe configured to allow the first exhaust gas to flow therein; a second individual exhaust pipe configured to allow the second exhaust gas to flow therein; and a switching unit configured to selectively communicate the main exhaust pipe with one of the first individual exhaust pipe and the second individual exhaust pipe. The switching unit includes a first switching mechanism provided between the first portion and the first individual exhaust pipe and configured to switch between a communication state where the first portion communicates with the first individual exhaust pipe when the first exhaust gas is exhausted from the liquid processing unit and a non-communication state where the first portion does not communicate with the first individual exhaust pipe when the exhaust gas other than the first exhaust gas is exhausted from the liquid processing unit; a second switching mechanism provided between the second portion and the second individual exhaust pipe and configured to switch between a communication state where the second portion communicates with the second individual exhaust pipe when the second exhaust gas is exhausted from the liquid processing unit and a non-communication state where the second portion does not communicate with the second individual exhaust pipe when the exhaust gas other than the second exhaust gas is exhausted from the liquid processing unit; a third switching mechanism provided between the first portion and the second portion of the main exhaust pipe and configured to switch between a closed state where a flow of the first exhaust gas to the second portion is blocked when the first exhaust gas is exhausted from the liquid processing unit and an open state where a flow of the exhaust gas other than the first exhaust gas to the second portion is allowed when the exhaust gas other than the first exhaust gas is exhausted from the liquid processing unit; an outside air introduction pipe connected to the second portion to allow outside air to be introduced into the second portion; and a fourth switching mechanism provided in the outside air introduction pipe and configured to switch between an open state where the flow of the first exhaust gas to the second portion is allowed when the first exhaust gas is exhausted from the liquid processing unit and a closed state where a flow of the outside air to the second portion is blocked when the exhaust gas other than the first exhaust gas is exhausted from the liquid processing unit.

In the example 1, the third switching mechanism is placed between the first portion and the second portion of the main exhaust pipe. Therefore, the third switching mechanism is in the closed state when the first exhaust gas is exhausted from the liquid processing unit. Thus, it is difficult for the first exhaust gas to flow toward the second portion provided on the downstream side of the third switching mechanism. Also, in the example 1, when the first exhaust gas is exhausted from the liquid processing unit, the outside air is introduced into the second portion from the outside air introduction pipe via the fourth switching mechanism. For this reason, even if there is the slight gap in the third switching mechanism due to the structure of the third switching mechanism (e.g., dimensional accuracy), the flow of the first exhaust gas in the second portion through the gap is suppressed by the outside air introduced into the second portion. Therefore, it is difficult for the first exhaust gas to reach the second individual exhaust pipe. As a result, when the substrate is processed in the liquid processing unit using the plurality of types of processing liquids, it is possible to suppress the introduction of the exhaust gas exhausted from the liquid processing unit into the individual exhaust pipes different from the individual exhaust pipe corresponding to the exhaust gas.

Example 2. In the substrate processing apparatus of the example 1, the multiple processing liquids may further include a third processing liquid different from the first processing liquid and the second processing liquid, the exhaust gas may further include a third exhaust gas exhausted from the liquid processing unit when the substrate is processed with the third processing liquid, the exhaust unit may further include a third individual exhaust pipe configured to allow the third exhaust gas to flow therein, the main exhaust pipe may further include a third portion located on a downstream side of the third switching mechanism, and the switching unit may further include a fifth switching mechanism, which is provided between the third portion and the third individual exhaust pipe and configured to switch between a communication state where the third portion communicates with the third individual exhaust pipe when the third exhaust gas is exhausted from the liquid processing unit and a non-communication state where the third portion does not communicate with the third individual exhaust pipe when the exhaust gas other than the third exhaust gas is exhausted from the liquid processing unit, and the switching unit is configured to selectively communicate the main exhaust pipe with any one of the first individual exhaust pipe, the second individual exhaust pipe and the third individual exhaust pipe. In this case, as in the substrate processing apparatus of the example 1, it is difficult for the first exhaust gas to reach the second individual exhaust pipe and the third individual exhaust pipe.

Example 3. In the substrate processing apparatus of the example 1 or 2, the first processing liquid may be an organic-based processing liquid, and the second processing liquid may be an acid-based processing liquid or an alkali-based processing liquid. In this case, it is possible to suppress the volatile organic compound from being mixed into the acid-based exhaust gas or the alkali-based exhaust gas. For this reason, it is possible to suppress air pollution caused by the gas exhausted through the second individual exhaust pipe.

Example 4. In the substrate processing apparatus of any one of the examples 1 to 3, when the first exhaust gas is exhausted from the liquid processing unit, a pressure in the second portion may be set to be higher than a pressure in the first portion by allowing the third switching mechanism to be in the closed state and the fourth switching mechanism to be in the open state. In this case, even if there is the slight gap in the third switching mechanism, the first exhaust gas hardly flows toward the second portion through the gap. For this reason, it is very difficult for the first exhaust gas to reach the second individual exhaust pipe.

Example 5. In the substrate processing apparatus of any one of the examples 1 to 4, the switching unit may further include a first sensor configured to measure a pressure in the first portion; a second sensor configured to measure a pressure in the second portion; and a regulator provided on an upstream side of the fourth switching mechanism in the outside air introduction pipe. The regulator may be configured to regulate an amount of the outside air introduced into the second portion such that the pressure measured by the second sensor is higher than the pressure measured by the first sensor. In this case, the same effect as obtained in the substrate processing apparatus of the example 4 can be achieved. Also, in this case, for example, even if the pressure in the first portion is changed due to the change in processing conditions of the liquid processing unit, the pressure in the second portion is regulated by the regulator such that the pressure in the second portion is higher than the pressure in the first portion. For this reason, it is possible to suppress the introduction of the first exhaust gas into the second portion regardless of the pressure change in the first portion.

Example 6. In the substrate processing apparatus of any one of the examples 1 to 5, the switching unit may be provided above the liquid processing unit. An exhaust gas may contain mist of the processing liquid. Since the mist is heavier than the gas, the exhaust gas may flow upwards, but it is difficult for the mist to flow upwards. That is, in the example 6, even if the exhaust gas immediately exhausted from the liquid processing unit contains the mist of the processing liquid, the mist is liquefied into droplets to fall down while the exhaust gas flows toward the switching unit. For this reason, the exhaust gas reaches the switching unit after the mist is separated from the gas. Therefore, it is possible to suppress the attachment of contaminants or foreign matters caused by the mist to the switching unit.

Example 7. In the substrate processing apparatus of any one of the examples 1 to 6, the switching unit may further include a sixth switching mechanism provided between the first portion and the first switching mechanism and configured to switch between a communication state where the first portion communicates with the first switching mechanism when the first exhaust gas is exhausted from the liquid processing unit and a non-communication state where the first portion does not communicate with the first switching mechanism when the exhaust gas other than the first exhaust gas is exhausted from the liquid processing unit. In this case, since the sixth switching mechanism is placed between the first portion and the first switching mechanism, the sixth switching mechanism is in a closed state when the second exhaust gas is exhausted from the liquid processing unit. Thus, it is difficult for the first exhaust gas to flow backwards from the first individual exhaust pipe via the first switching mechanism. For this reason, it is more difficult for the first exhaust gas to reach the second individual exhaust pipe.

Example 8. A substrate processing method of processing a substrate using the substrate processing apparatus of any one of the examples 1 to 7 includes: allowing the first switching mechanism to be in the communication state, the second switching mechanism to be in the non-communication state, the third switching mechanism to be in the closed state and the fourth switching mechanism to be in the open state; processing the substrate with the first processing liquid in the liquid processing unit after the allowing of the first switching mechanism to be in the communication state; allowing the first switching mechanism to be in the non-communication state, the second switching mechanism to be in the communication state, the third switching mechanism to be in the open state and the fourth switching mechanism to be in the closed state; and processing the substrate with the second processing liquid in the liquid processing unit after the allowing of the first switching mechanism to be in the non-communication state. In this case, the same effect as obtained in the substrate processing apparatus of the example 1 can be achieved.

According to the substrate processing apparatus and the substrate processing method of the present disclosure, when the substrate is processed in the liquid processing unit using the plurality of types of processing liquids, it is possible to suppress the introduction of the gas exhausted from the liquid processing unit into the individual exhaust pipe different from the individual exhaust pipe corresponding to the exhausted gas.

From the foregoing, it will be appreciated that various exemplary embodiments of the present disclosure have been described herein for purposes of illustration and various changes can be made without departing from the scope and spirit of the present disclosure. Accordingly, various exemplary embodiments described herein are not intended to be limiting, and the true scope and spirit are indicated by the following claims.

We claim:

1. A substrate processing apparatus, comprising:
a liquid processing unit configured to supply, onto a front surface of a substrate, individual multiple processing liquids including a first processing liquid and a second processing liquid different from the first processing liquid; and
an exhaust unit configured to exhaust an exhaust gas exhausted from the liquid processing unit to an outside, the exhaust gas including a first exhaust gas exhausted from the liquid processing unit when the substrate is processed with the first processing liquid and a second exhaust gas exhausted from the liquid processing unit when the substrate is processed with the second processing liquid,
wherein the exhaust unit includes:
a main exhaust pipe configured to allow the exhaust gas to flow therein, the main exhaust pipe including a first portion located on an upstream side and a second portion located on a downstream side of the first portion;
a first individual exhaust pipe configured to allow the first exhaust gas to flow therein;
a second individual exhaust pipe configured to allow the second exhaust gas to flow therein; and
a switching unit configured to selectively communicate the main exhaust pipe with one of the first individual exhaust pipe and the second individual exhaust pipe, and
wherein the switching unit includes:
a first switching mechanism provided between the first portion and the first individual exhaust pipe and configured to switch between a communication state where the first portion communicates with the first individual exhaust pipe when the first exhaust gas is exhausted from the liquid processing unit and a non-communication state where the first portion does not communicate with the first individual exhaust pipe when the exhaust gas other than the first exhaust gas is exhausted from the liquid processing unit;
a second switching mechanism provided between the second portion and the second individual exhaust pipe and configured to switch between a communication state where the second portion communicates with the second individual exhaust pipe when the second exhaust gas is exhausted from the liquid processing unit and a non-communication state where the second portion does not communicate with the second individual exhaust pipe when the exhaust gas other than the second exhaust gas is exhausted from the liquid processing unit;
a third switching mechanism provided between the first portion and the second portion of the main exhaust pipe and configured to switch between a closed state where a flow of the first exhaust gas to the second portion is blocked when the first exhaust gas is exhausted from the liquid processing unit and an open state where a flow of the exhaust gas other than the first exhaust gas to the second portion is allowed when the exhaust gas other than the first exhaust gas is exhausted from the liquid processing unit;
an outside air introduction pipe connected to the second portion to allow outside air to be introduced into the second portion; and
a fourth switching mechanism provided in the outside air introduction pipe and configured to switch between an open state where a flow of the outside air to the second portion is allowed when the first exhaust gas is exhausted from the liquid processing unit and a closed state where the flow of the outside air to the second portion is blocked when the exhaust gas other than the first exhaust gas is exhausted from the liquid processing unit.

2. The substrate processing apparatus of claim 1,
wherein the multiple processing liquids further include a third processing liquid different from the first processing liquid and the second processing liquid,
the exhaust gas further includes a third exhaust gas exhausted from the liquid processing unit when the substrate is processed with the third processing liquid,
the exhaust unit further includes a third individual exhaust pipe configured to allow the third exhaust gas to flow therein,
the main exhaust pipe further includes a third portion located on a downstream side of the third switching mechanism, and
the switching unit further includes a fifth switching mechanism, which is provided between the third portion and the third individual exhaust pipe and configured to switch between a communication state where the third portion communicates with the third individual exhaust pipe when the third exhaust gas is exhausted from the liquid processing unit and a non-communication state where the third portion does not communicate with the third individual exhaust pipe when the exhaust gas other than the third exhaust gas is exhausted from the liquid processing unit, and the switching unit is configured to selectively communicate the main exhaust pipe with any one of the first individual exhaust pipe, the second individual exhaust pipe and the third individual exhaust pipe.

3. The substrate processing apparatus of claim 1,
wherein the first processing liquid is an organic-based processing liquid, and
the second processing liquid is an acid-based processing liquid or an alkali-based processing liquid.

4. The substrate processing apparatus of claim 2,
wherein the first processing liquid is an organic-based processing liquid, and
the second processing liquid is an acid-based processing liquid or an alkali-based processing liquid.

5. The substrate processing apparatus of claim 1,
wherein when the first exhaust gas is exhausted from the liquid processing unit, a pressure in the second portion is set to be higher than a pressure in the first portion by allowing the third switching mechanism to be in the closed state and the fourth switching mechanism to be in the open state.

6. The substrate processing apparatus of claim 2,
wherein when the first exhaust gas is exhausted from the liquid processing unit, a pressure in the second portion is set to be higher than a pressure in the first portion by allowing the third switching mechanism to be in the closed state and the fourth switching mechanism to be in the open state.

7. The substrate processing apparatus of claim 3,
wherein when the first exhaust gas is exhausted from the liquid processing unit, a pressure in the second portion is set to be higher than a pressure in the first portion by allowing the third switching mechanism to be in the closed state and the fourth switching mechanism to be in the open state.

8. The substrate processing apparatus of claim 4,
wherein when the first exhaust gas is exhausted from the liquid processing unit, a pressure in the second portion is set to be higher than a pressure in the first portion by allowing the third switching mechanism to be in the closed state and the fourth switching mechanism to be in the open state.

9. The substrate processing apparatus of claim 1,
wherein the switching unit further includes:
a first sensor configured to measure a pressure in the first portion;
a second sensor configured to measure a pressure in the second portion; and
a regulator provided on an upstream side of the fourth switching mechanism in the outside air introduction pipe, and
wherein the regulator is configured to regulate an amount of the outside air introduced into the second portion such that the pressure measured by the second sensor is higher than the pressure measured by the first sensor.

10. The substrate processing apparatus of claim 2,
wherein the switching unit further includes:
a first sensor configured to measure a pressure in the first portion;
a second sensor configured to measure a pressure in the second portion; and
a regulator provided on an upstream side of the fourth switching mechanism in the outside air introduction pipe, and
wherein the regulator is configured to regulate an amount of the outside air introduced into the second portion such that the pressure measured by the second sensor is higher than the pressure measured by the first sensor.

11. The substrate processing apparatus of claim 3,
wherein the switching unit further includes:
a first sensor configured to measure a pressure in the first portion;
a second sensor configured to measure a pressure in the second portion; and
a regulator provided on an upstream side of the fourth switching mechanism in the outside air introduction pipe, and
wherein the regulator is configured to regulate an amount of the outside air introduced into the second portion such that the pressure measured by the second sensor is higher than the pressure measured by the first sensor.

12. The substrate processing apparatus of claim 4,
wherein the switching unit further includes:
a first sensor configured to measure a pressure in the first portion;
a second sensor configured to measure a pressure in the second portion; and
a regulator provided on an upstream side of the fourth switching mechanism in the outside air introduction pipe, and
wherein the regulator is configured to regulate an amount of the outside air introduced into the second portion such that the pressure measured by the second sensor is higher than the pressure measured by the first sensor.

13. The substrate processing apparatus of claim 5,
wherein the switching unit further includes:
a first sensor configured to measure a pressure in the first portion;
a second sensor configured to measure a pressure in the second portion; and
a regulator provided on an upstream side of the fourth switching mechanism in the outside air introduction pipe, and
wherein the regulator is configured to regulate an amount of the outside air introduced into the second portion such that the pressure measured by the second sensor is higher than the pressure measured by the first sensor.

14. The substrate processing apparatus of claim 6,
wherein the switching unit further includes:
a first sensor configured to measure a pressure in the first portion;
a second sensor configured to measure a pressure in the second portion; and
a regulator provided on an upstream side of the fourth switching mechanism in the outside air introduction pipe, and
wherein the regulator is configured to regulate an amount of the outside air introduced into the second portion such that the pressure measured by the second sensor is higher than the pressure measured by the first sensor.

15. The substrate processing apparatus of claim 7,
wherein the switching unit further includes:
a first sensor configured to measure a pressure in the first portion;
a second sensor configured to measure a pressure in the second portion; and
a regulator provided on an upstream side of the fourth switching mechanism in the outside air introduction pipe, and
wherein the regulator is configured to regulate an amount of the outside air introduced into the second portion such that the pressure measured by the second sensor is higher than the pressure measured by the first sensor.

16. The substrate processing apparatus of claim 8,
wherein the switching unit further includes:
a first sensor configured to measure a pressure in the first portion;
a second sensor configured to measure a pressure in the second portion; and
a regulator provided on an upstream side of the fourth switching mechanism in the outside air introduction pipe, and
wherein the regulator is configured to regulate an amount of the outside air introduced into the second portion such that the pressure measured by the second sensor is higher than the pressure measured by the first sensor.

17. The substrate processing apparatus of claim 1,
wherein the switching unit is provided above the liquid processing unit.

18. The substrate processing apparatus of claim 2,
wherein the switching unit is provided above the liquid processing unit.

19. The substrate processing apparatus of claim 1,
wherein the switching unit further includes a sixth switching mechanism provided between the first portion and the first switching mechanism and configured to switch between a communication state where the first portion communicates with the first switching mechanism when the first exhaust gas is exhausted from the liquid processing unit and a non-communication state where the first portion does not communicate with the first switching mechanism when the exhaust gas other than the first exhaust gas is exhausted from the liquid processing unit.

20. A substrate processing method of processing a substrate using the substrate processing apparatus of claim 1, the substrate processing method comprising:
allowing the first switching mechanism to be in the communication state, the second switching mechanism to be in the non-communication state, the third switching mechanism to be in the closed state and the fourth switching mechanism to be in the open state;
processing the substrate with the first processing liquid in the liquid processing unit after the allowing of the first switching mechanism to be in the communication state;
allowing the first switching mechanism to be in the non-communication state, the second switching mechanism to be in the communication state, the third switching mechanism to be in the open state and the fourth switching mechanism to be in the closed state; and
processing the substrate with the second processing liquid in the liquid processing unit after the allowing of the first switching mechanism to be in the non-communication state.

\* \* \* \* \*